United States Patent
Wang

(10) Patent No.: US 7,902,928 B2
(45) Date of Patent: Mar. 8, 2011

(54) PHASE-LOCKED CIRCUIT EMPLOYING CAPACITANCE MULTIPLICATION

(75) Inventor: Ping-Ying Wang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 61 days.

(21) Appl. No.: 12/028,019

(22) Filed: Feb. 8, 2008

(65) Prior Publication Data
US 2009/0201093 A1    Aug. 13, 2009

(51) Int. Cl.
*H03L 7/093* (2006.01)
*H03L 7/22* (2006.01)
(52) U.S. Cl. .................. 331/17; 331/16; 331/25
(58) Field of Classification Search ............. 331/16, 331/17, 25
See application file for complete search history.

(56) References Cited

U.S. PATENT DOCUMENTS

| | | | |
|---|---|---|---|
| 6,344,772 B1 | 2/2002 | Larsson | |
| 6,580,376 B2 * | 6/2003 | Perrott | 341/61 |
| 6,909,329 B2 | 6/2005 | Jasa et al. | |
| 7,154,345 B2 * | 12/2006 | Moyal et al. | 331/17 |

FOREIGN PATENT DOCUMENTS
CN    1893331    1/2007

OTHER PUBLICATIONS

English language translation of abstract of CN 1893331 (published Jan. 10, 2007).

* cited by examiner

*Primary Examiner* — Robert Pascal
*Assistant Examiner* — James E Goodley
(74) *Attorney, Agent, or Firm* — Thomas|Kayden

(57) ABSTRACT

A phase-locked loop circuit. The phase-locked loop circuit comprises a phase detector, a proportional charge pump, a decimator, an integral charge pimp, and a voltage-controlled oscillator. The phase detector obtains an phase error information according to a phase difference between a reference signal and a clock signal input to the phase detector. The proportional charge pump coupled to the phase detector generates a first voltage according to the phase error information. The decimator generates a decimated version of the phase error information by a decimation factor of N. The integral charge pump generates a second voltage according to the decimated version of the phase error information. The voltage-controlled oscillator generating the clock signal according to a combination of the first and second voltages.

19 Claims, 5 Drawing Sheets

PHASE-LOCKED CIRCUIT EMPLOYING CAPACITANCE MULTIPLICATION

BACKGROUND OF THE INVENTION

Field of the Invention

The present invention relates to phase-locked loop (PLL) circuits, and, more particularly, to charge-pump PLLs.

A phase-locked loop circuit is a circuit that generates, or synthesizes, a periodic output signal that has a constant phase and frequency with respect to a periodic input signal. PLLs are widely used in many types of measurement, microprocessor, and communication applications. One type of phase-locked loop is the charge-pump PLL.

FIG. 1 shows a conventional charge-pump phase-locked loop circuit 10 comprising a phase detector 102, an integral charge pump 104, a proportional charge pump 106, and a voltage-controlled oscillator 108. The phase detector 102 compares the phase $\theta_{IN}$ of a reference signal to the phase $\theta_{OUT}$ of a feedback clock signal derived from the PLL output. Based on the comparison, the phase detector 102 generates an error signal: either an UP signal (when $\theta_{IN}$ leads $\theta_{OUT}$) or a DOWN signal (when $\theta_{OUT}$ leads $\theta_{IN}$), where the error signal indicates the magnitude of the difference between $\theta_{IN}$ and $\theta_{OUT}$. The integral charge pump 104 generates an amount of charge based on the integration of the error signal from the phase detector 102 to capacitor C1, where the sign of that charge indicates the direction of UP or DOWN. Depending on whether the error signal is an UP signal or a DOWN signal, the charge is either added to or subtracted from a capacitor. As such, the charge pump operates as an integrator that accumulates the net charge of the capacitor. Similarly, proportional charge pump 106 generates another amount of charge based on the proportional of the error signal from the phase detector 102 to the resistor R1. Here, "generating" current refers to adding or subtracting charge with positive or negative current to an according UP or DOWN signal, respectively. Voltages across capacitor C1 and resistor R1 are combined by voltage adder 112. The resulting voltage of the voltage adder 112 is applied to a voltage-controlled oscillator (VCO) 108. The voltage-controlled oscillator 108 is a device that generates a periodic output signal, whose frequency is a function of the VCO input voltage. Fractional feedback divider 110 may be placed in the feedback path, if the frequency of the output signal is to be either a fraction or a multiple of the frequency of the input signal.

One issue of designing charge pump PLL is stability. As the stability of charge pump PLL increases when the capacitance increases, the capacitance of the integral charge pump path needs to be as large as possible. A satisfactory capacitance is typically large, hence, costs are increased.

BRIEF SUMMARY OF THE INVENTION

Accordingly, a charge pump phase-locked loop circuit with a smaller area is provided. The phase-locked loop circuit comprises a phase detector, a proportional charge pump, a decimator, an integral charge pimp, and a voltage-controlled oscillator. The phase detector obtains phase error information according to a phase difference between a reference signal and a clock signal input to the phase detector. The proportional charge pump coupled to the phase detector generates a first voltage according to the phase error information. The decimator generates a decimated version of the phase error information by a decimation factor of N. The integral charge pump generates a second voltage according to the decimated version of the phase error information. The voltage-controlled oscillator generating the clock signal according to a combination of the first and second voltages.

The invention also provides another phase-locked loop circuit. The phase-locked loop circuit comprises a first and second decimator, a first and second phase detector, a proportional charge pump, an integral charge pump, and a voltage-controlled oscillator. The first decimator receives a reference signal to generating a decimated version of a reference signal by a decimation factor N. The second decimator receives a clock signal to generate a decimated version of a clock signal by a decimation factor of N. The first phase detector obtains first phase error information according to a phase difference between the decimated version of the reference signal and the decimated version of the clock signal input to the first phase detector. The second phase detector obtains second phase error information according to a phase difference between the reference signal and the clock signal input to the second phase detector. The proportional charge pump generates a first voltage according to the second phase error information. The integral charge pump generates a second voltage according to the first phase error information. The voltage-controlled oscillator (VCO) generating the clock signal according to a combination of the first and second voltages.

BRIEF DESCRIPTION OF THE DRAWINGS

The invention will become more fully understood from the detailed description, given herein below, and the accompanying drawings. The drawings and description are provided for purposes of illustration only, and, thus, are not intended to be limiting of the present invention.

DETAILED DESCRIPTION OF THE INVENTION

Figure 2:
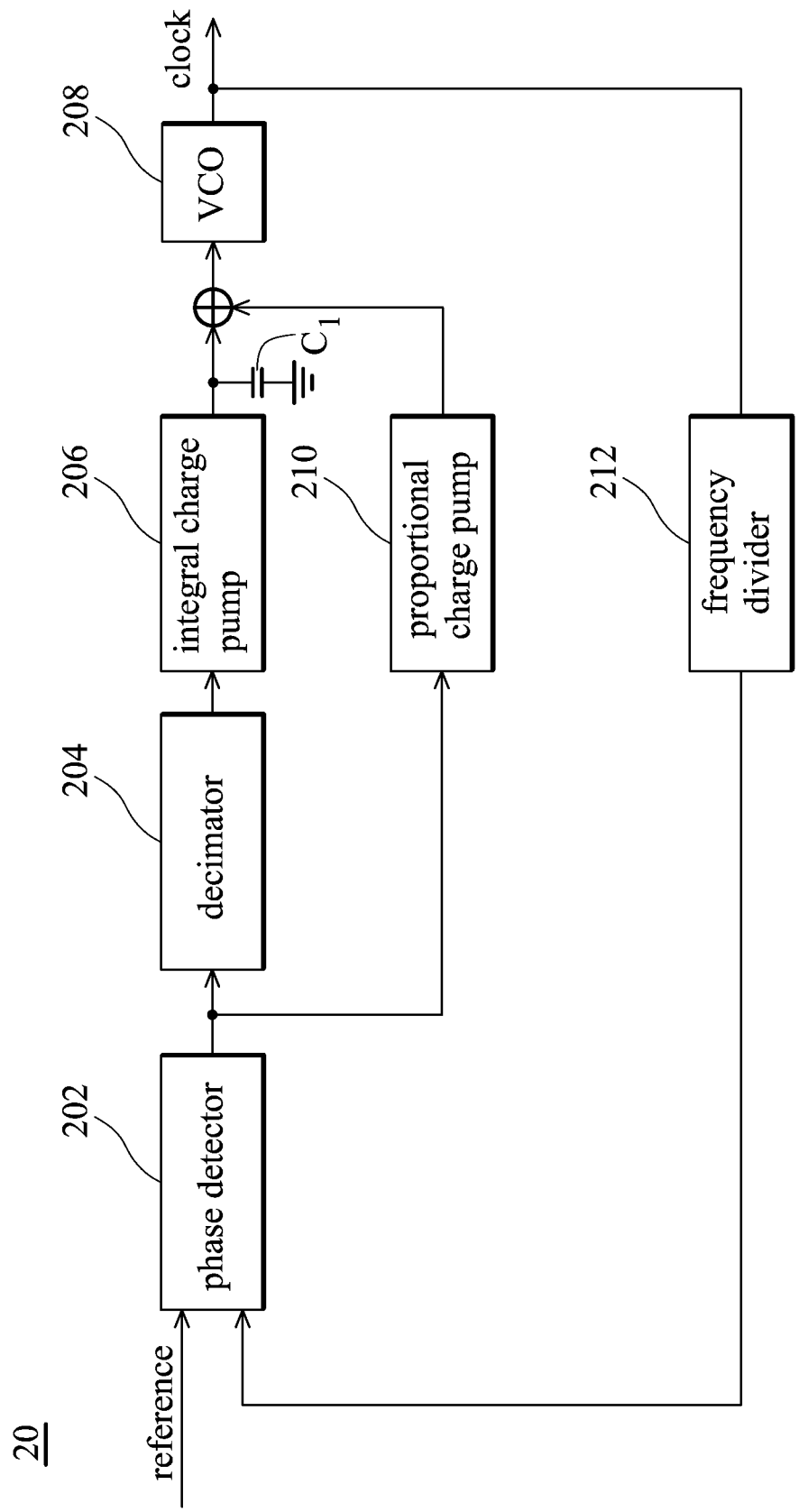
FIG. 2 shows a phase-locked loop circuit according to an embodiment of the invention.

FIG. 2 shows a phase-locked loop circuit 20 comprising a phase detector 202, a proportional charge pump 210, a decimator 204, an integral charge pump 206, and a voltage-controlled oscillator 208. The phase detector 202 obtains phase error information according to phase differences between a reference signal and a clock signal input to the phase detector. For better loop performance, the phase detector 202 can be a phase/frequency detector in other embodiments. The decimator 204 generates a decimated version of the phase error information by a decimation factor of N. The function of the decimator is described in detail with reference to FIGS. 3 and 4. The proportional charge pump 210 coupled to the phase detector 202 generates a first voltage according to the phase error information. The integral charge pump 206 generates a second voltage according to the decimated version of the phase error information. The voltage-controlled oscillator 208 generates the clock signal according to a combination of the first and second voltages. For wider operating range of the phase-locked loop circuit, a frequency divider 212 coupled to the voltage-controlled oscillator 08 divides the frequency of the clock signal by M.

In some embodiments of the invention, C1 may be formed in an integrated circuit, thus, the inner loop is achieves the desired stability for all operating frequencies of the PLL. If capacitor C1 is an external component of an integrated circuit, capacitor C1 might be set as large as is required for a given implementation in order to satisfy the stability requirement, but if capacitor C1 is formed in an integrated circuit, limits might be imposed on the value of C1.

Figure 1:
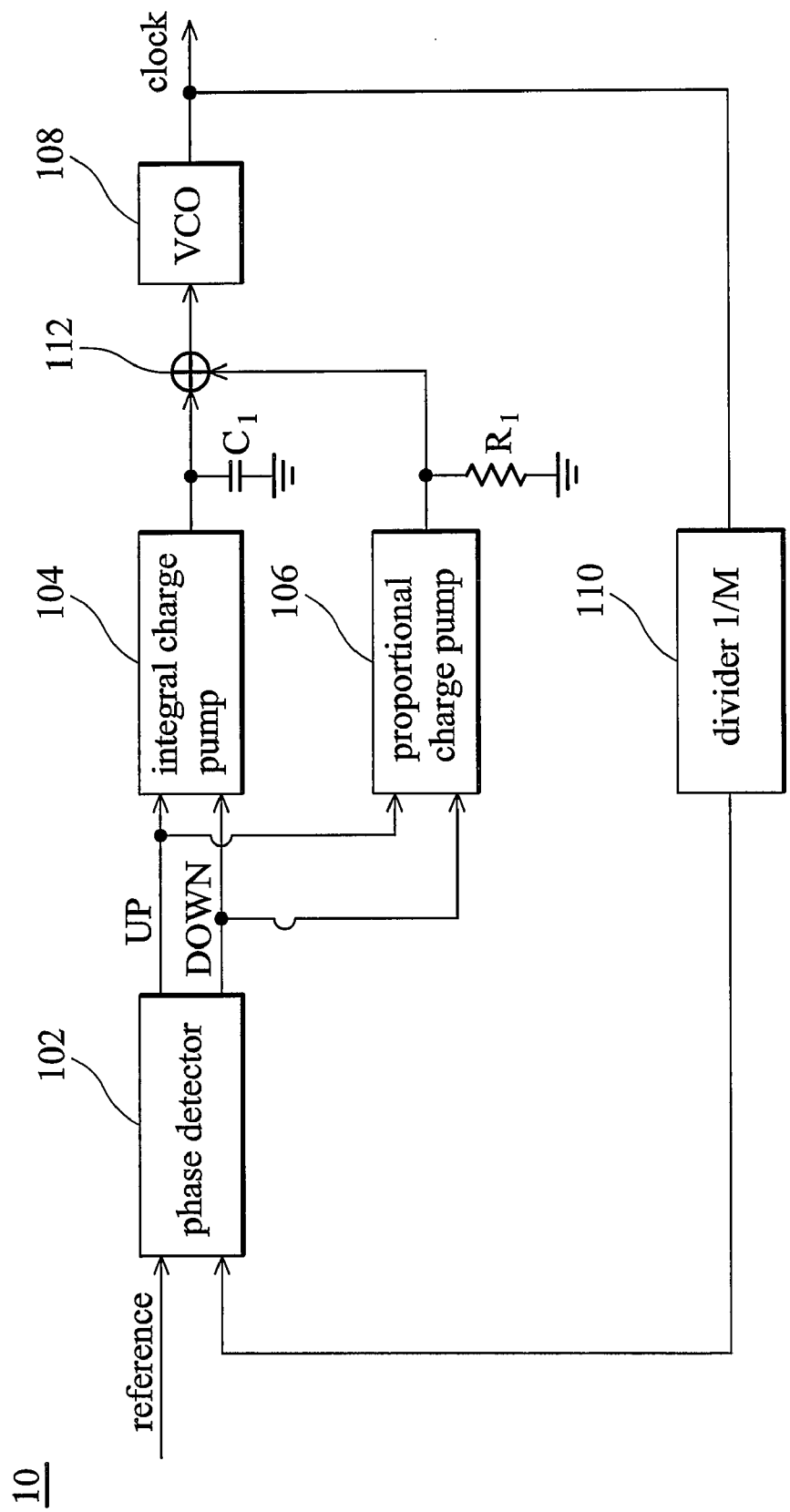
FIG. 1 shows a conventional charge pump phase-locked loop circuit.

Employing decimator 204 allows for capacitance multiplication. Capacitance multiplication is a characteristic of a circuit that makes a capacitance value appear to be larger than the actual capacitance of a circuit component. By decimating N times of charge from integral charge pump 206, the value of capacitance C1 is equivalent to N times. For example, if the capacitor C1 in FIG. 1 can carry W charges and one UP signal brings W/N charges to the capacitor C1. Thus, N times of UP signals fill the capacitor C1 in FIG. 1. The decimator 204 in FIG. 2 in this embodiment allows 1/N amount of charge to flow into the capacitor C1 in FIG. 2, hence, the capacity of C1 in FIG. 2 is equivalently increased.

Figure 3:
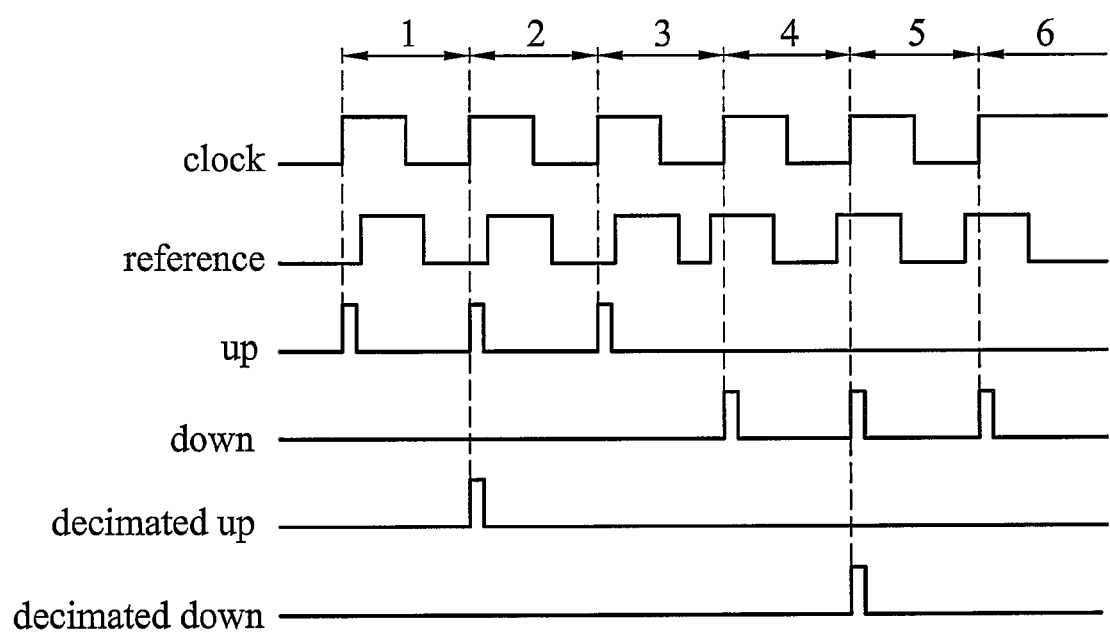
FIG. 3 shows a timing chart of the reference signal, clock signal, up signal and down signal.

In some embodiments of the invention, the phase error information comprises an up signal and a down signal, both having a series of pulses, representing the clock signal leading and falling behind the reference signal respectively. FIG. 3 shows the timing chart of the reference signal, clock signal, up signal and down signal. In the first three clock periods, the clock signal leads the reference signal, thus the up signal pulses when the clock signal is at the rising edge. In the clock periods 4, 5 and 6, the clock signal falls behind the reference signal, thus the down signal has pulses at the rising edge of the clock signal. The decimator outputs a decimated up signal and a decimated down signal every N pulses. In this embodiment, the decimator outputs one pulse after receiving 2 pulses, thus pulses of clock periods 1 and 3 of the up signal are ignored, and only the second pulse of the up signal is left. Similarly, the pulses of clock periods 4 and 6 of the down signal are ignored, and only the fifth pulse of the down signal is left. In one aspect of the invention, the decimator is a down-sampler down-sampling the up and down signals. In another aspect of the invention, the decimator is a mask, blocking out N−1 pulses and leaving one pulse as the decimated version of the phase error information.

In another embodiment of the invention, the phase error information is a number representing the amount of the phase error. The decimator is a divider dividing the number by the factor N to generate the decimated version of the phase error information.

Figure 5:
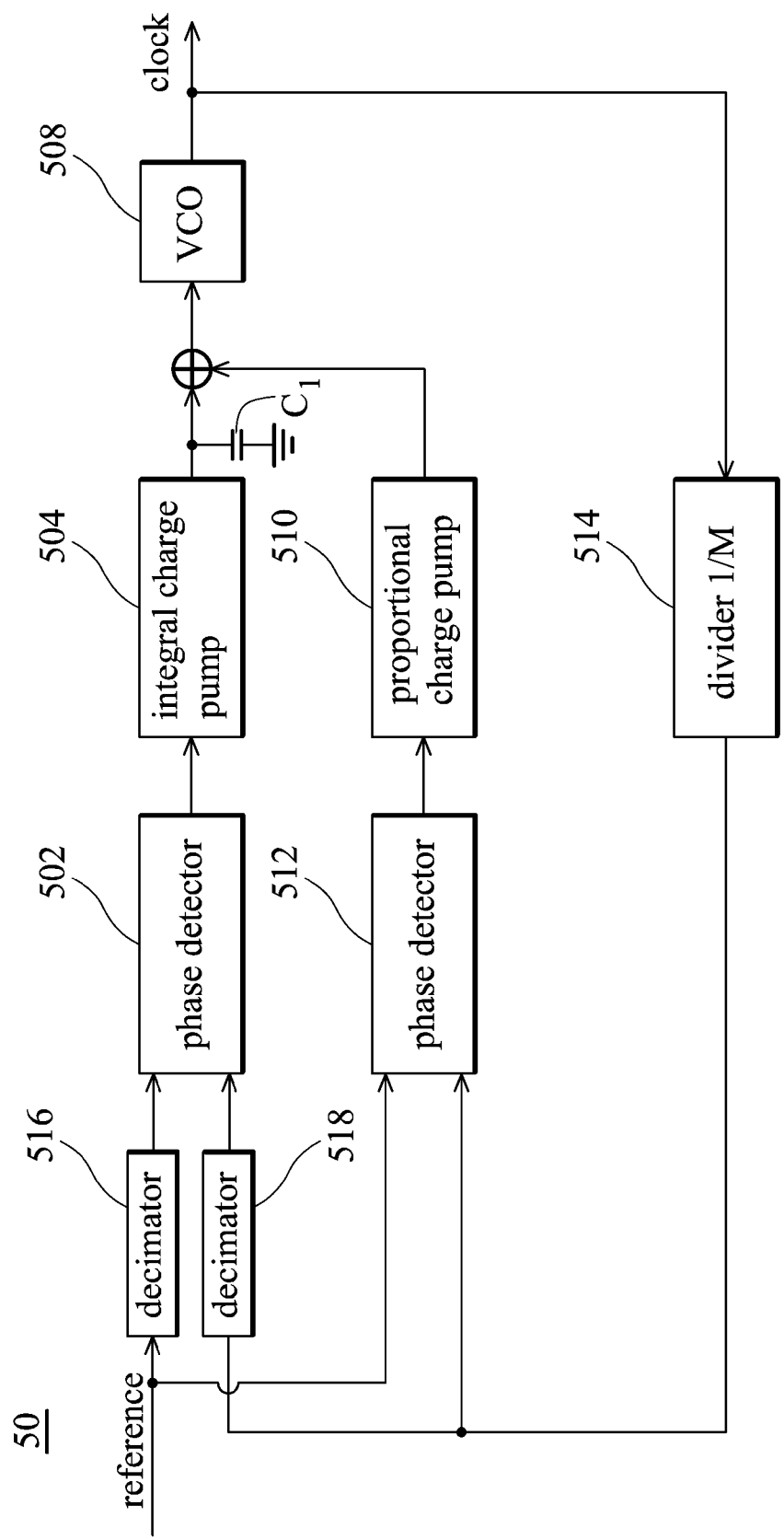
FIG. 5 shows another phase-locked loop according to an embodiment of the invention.

FIG. 5 shows another phase-locked loop 50 according to the embodiment of the invention. The phase-locked loop circuit 50 comprises a first and second decimator 516 and 518, a first and second phase detector 502 and 512, a proportional charge pump 510, an integral charge pump 504, and a voltage-controlled oscillator 508. The first decimator 516 receives a reference signal for generating a decimated version of a reference signal by a decimation factor N. The second decimator 518 receives a clock signal to generate a decimated version of a clock signal by a decimation factor of N. The first phase detector 502 obtains first phase error information according to a phase difference between the decimated version of the reference signal and the decimated version of the clock signal. The second phase detector 512 obtains second phase error information according to a phase difference between the reference signal and the clock signal input to the second phase detector 512. For better loop performance, the first and second phase detectors 502 and 512 can be phase/frequency detectors in other embodiments. The proportional charge pump 510 generates a first voltage according to the second phase error information. The integral charge pump 504 generates a second voltage according to the first phase error information. The voltage-controlled oscillator (VCO) 508 generates the clock signal according to a combination of the first and second voltages. For wider operating range of the phase locked loop circuit, a frequency divider coupled to the voltage-controlled oscillator 508 divides the frequency of the clock signal by M.

Figure 4:
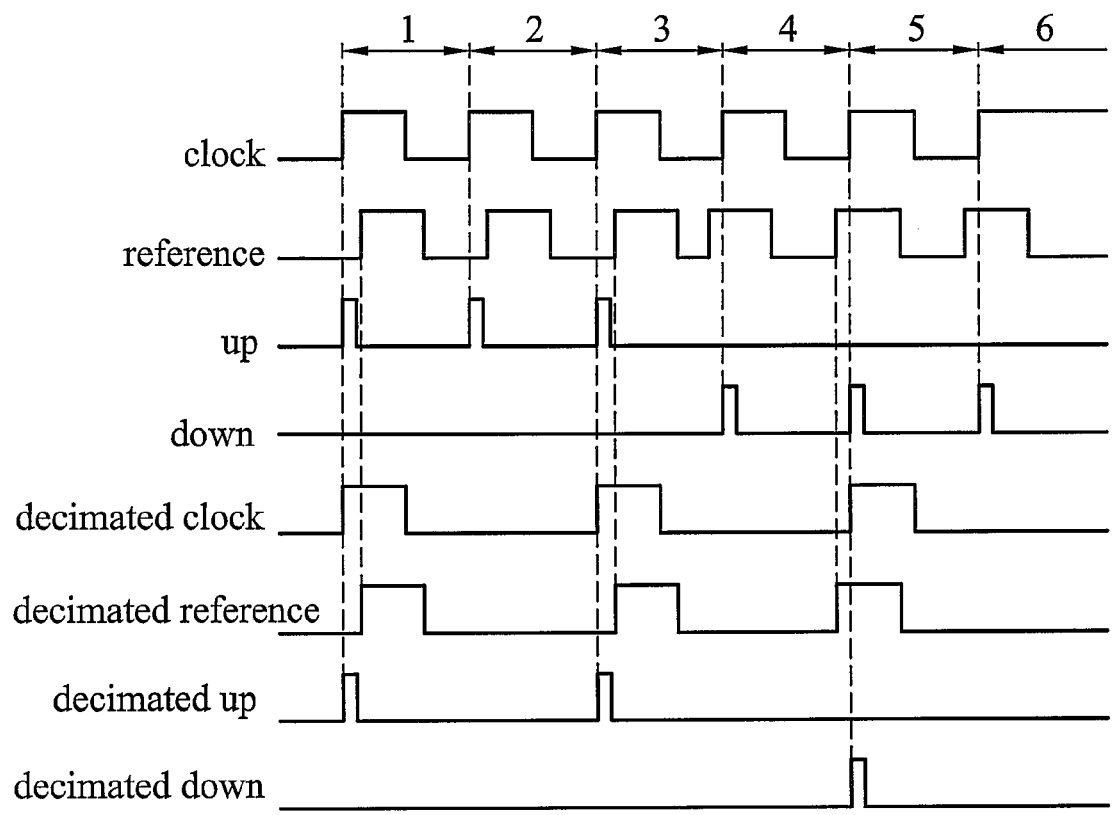
FIG. 4 shows another timing chart of the reference signal, clock signal, up signal and down signal.

In some embodiments, the second phase error information comprises an up signal and a down signal, having a series of pulses, representing the clock signal leading and falling behind the reference signal respectively, as depicted in FIG. 4. The first decimator 516 outputs one pulse of the reference signal every N pulses. Similarly, the second decimator 518 outputs one pulse of the clock signal every N pulses. The decimated pulses of the reference signal and clock signal should be closed as much as to each other. For example, the decimated clock signal reserves pulses 1, 3, and 5, and ignores the pulses 2, 4, and 6. Thus, the decimated reference signal generated by the second decimator 518 must reserves pulses 1, 3, and 5 of the reference signal and blocks clock pulses 2, 4, and 6 of the reference signal. The first phase detector 502 outputs the decimated up signal and the decimated down signal according to the decimated clock signal and the decimated reference signal. In one aspect of the invention, the first and second decimator 516 and 518 may be down-samplers down-sampling the reference and clock signals. In another aspect of the invention, the first and second decimators 516 and 518 may be a mask blocking out part of the reference and clock signals.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-locked loop circuit comprising:
   an analog phase detector generating analog phase error information according to a phase difference between a reference signal and a clock signal input to the analog phase detector;
   a proportional charge pump coupled to the analog phase detector, generating a first voltage according to the analog phase error information;
   a decimator generating a decimated version of the analog phase error information by a decimation factor of N;
   an integral charge pump generating a second voltage according to the decimated version of the analog phase error information; and
   a voltage-controlled oscillator generating the clock signal according to a combination of the first and second voltages.

2. The phase-locked loop circuit as claimed in claim 1, wherein the analog phase error information is an up/down signal having a series of pulses, and the decimator samples one pulse of the up/down signal every N pulses of the up/down signal.

3. The phase-locked loop circuit as claimed in claim 2, wherein the decimator is a masker masking N−1 pulses and leaving one pulse as the decimated version of the analog phase error information.

4. The phase-locked loop circuit as claimed in claim 1, wherein the analog phase error information comprises an up signal and a down signal, both having a series of pulses, representing the clock signal leading and falling behind the reference signal respectively, and the decimator outputs one pulse of the up signal and one pulse of the down signal every N pulses.

5. The phase-locked loop circuit as claimed in claim 1, wherein the analog phase error information represents an amount of the phase difference, and the decimator is a divider dividing the number by a factor N to generate the decimated version of the analog phase error information.

6. The phase-locked loop circuit as claimed in claim 1 further comprising a frequency divider coupled to the voltage-controlled oscillator to divide the clock signal by a factor of M, and phase detector obtaining the analog phase error information according to the phase difference between the reference signal and a frequency-divided clock signal input to the analog phase detector.

7. The phase-locked loop circuit as claimed in claim 1, wherein the analog phase detector is a phase-frequency detector.

8. A phase-locked loop circuit comprising:
- an analog phase detector generating analog phase error information according to a phase difference between a reference signal and a clock signal input to the analog phase detector;
- a proportional charge pump coupled to the analog phase detector, generating a first voltage according to the analog phase error information;
- a decimator generating a decimated version of the analog phase error information by a decimation factor of N;
- a capacitor;
- an integral charge pump generating a second voltage across the capacitor such that the capacitance of the capacitor being equivalently multiplicated due to the decimated version of the analog phase error information; and
- a voltage-controlled oscillator generating the clock signal according to a combination of the first and second voltages.

9. The phase-locked loop circuit as claimed in claim 8, wherein the decimator allows 1/N amount of charges to flow into the capacitor.

10. The phase-locked loop circuit as claimed in claim 8, wherein the analog phase error information is an up/down signal having a series of pulses, and the decimator samples one pulse of the up/down signal every N pulses of the up/down signal.

11. The phase-locked loop circuit as claimed in claim 10, wherein the decimator is a masker masking N−1 pulses and leaving one pulse as the decimated version of the analog phase error information.

12. The phase-locked loop circuit as claimed in claim 8, wherein the analog phase error information comprises an up signal and a down signal, both having a series of pulses, representing the clock signal leading and falling behind the reference signal respectively, and the decimator outputs one pulse of the up signal and one pulse of the down signal every N pulses.

13. The phase-locked loop circuit as claimed in claim 8, wherein the analog phase error information represents an amount of the phase difference, and the decimator is a divider dividing the number by the factor N to generate the decimated version of the analog phase error information.

14. The phase-locked loop circuit as claimed in claim 8 further comprising a frequency divider coupled to the voltage-controlled oscillator to divide the clock signal by a factor of M, and the phase detector obtaining the analog phase error information according to the analog phase difference between the reference signal and a frequency-divided clock signal input to the analog phase detector.

15. The phase-locked loop circuit as claimed in claim 8, wherein the analog phase detector is a phase-frequency detector.

16. The phase-locked loop circuit as claimed in claim 1, wherein the analog phase error information is represented by pulse width.

17. The phase-locked loop circuit as claimed in claim 1, wherein the integral charge pump is arranged to directly receive the decimated version of the analog phase error information to generate the second voltage.

18. The phase-locked loop circuit as claimed in claim 8, wherein the analog phase error information is represented by pulse width.

19. The phase-locked loop circuit as claimed in claim 8, wherein the integral charge pump is arranged to directly receive the decimated version of the analog phase error information to generate the second voltage.

* * * * *

UNITED STATES PATENT AND TRADEMARK OFFICE
CERTIFICATE OF CORRECTION

PATENT NO. : 7,902,928 B2  Page 1 of 1
APPLICATION NO. : 12/028019
DATED : March 8, 2011
INVENTOR(S) : Wang It is certified that error appears in the above-identified patent and that said Letters Patent is hereby corrected as shown below:

Title Page, Item (54) Title:

The title should read "Phase-Locked Loop Circuit Employing Capacitance Multiplication"

Signed and Sealed this
Nineteenth Day of April, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,902,928 B2 | Page 1 of 1 |
| APPLICATION NO. | : 12/028019 | |
| DATED | : March 8, 2011 | |
| INVENTOR(S) | : Wang | |

It is certified that error appears in the above-identified patent and that said Letters Patent is hereby corrected as shown below:

Title Page, Item (54) and at Column 1, lines 1 and 2, Title:

The title should read "Phase-Locked Loop Circuit Employing Capacitance Multiplication"

This certificate supersedes the Certificate of Correction issued April 19, 2011.

Signed and Sealed this
Seventeenth Day of May, 2011

David J. Kappos
*Director of the United States Patent and Trademark Office*